United States Patent [19]

Comerford et al.

[11] Patent Number: 5,432,793
[45] Date of Patent: Jul. 11, 1995

[54] RESPONSE EXPANDER BOARD

[75] Inventors: James P. Comerford, Manhasset; Thomas M. Mannle, Franklin Square, both of N.Y.

[73] Assignee: Grumman Aerospace Corporation, Bethpage, N.Y.

[21] Appl. No.: 153,194

[22] Filed: Nov. 17, 1993

[51] Int. Cl.6 .............................................. H04J 3/02
[52] U.S. Cl. .................................. 370/112; 371/22.1
[58] Field of Search .............. 370/112, 53, 58.1, 58.2, 370/58.3, 66, 68.1, 76; 324/600, 601, 602, 603, 604, 605, 612, 527; 371/22.1, 29.1, 15.1, 23, 24, 25.1, 26, 27, 28

[56] References Cited

U.S. PATENT DOCUMENTS

| | | | |
|---|---|---|---|
| 3,922,537 | 11/1975 | Jackson | 371/15.1 |
| 4,593,390 | 6/1986 | Hildebrand et al. | 370/112 |
| 5,239,546 | 8/1993 | Hayashi | 370/112 |
| 5,282,213 | 1/1994 | Leigh et al. | 371/22.1 |

*Primary Examiner*—Douglas W. Olms
*Assistant Examiner*—Huy D. Vu
*Attorney, Agent, or Firm*—Bacon & Thomas

[57] ABSTRACT

A response expander circuit provides to a unit under test a number of response channels which is greater than the number of response channels provided by a basic test control unit. The increased response channel count is accomplished by separating the channels available to the unit under test into two separate patterns, and time division multiplexing the two patterns so that the two patterns are sequentially supplied to the basic test control unit for processing.

10 Claims, 12 Drawing Sheets

RESPONSE EXPANDER BOARD

BACKGROUND OF THE INVENTION

1. Field of the Invention

This invention relates to an interface circuit suitable for use with an automated test station of the type in which a test control unit sends stimulus information to a unit under test (UUT), samples responses from the UUT, and analyzes the responses to determine whether the UUT is good or faulty, and more particularly to an interface circuit which generates additional response channels from the response channels provided by the test control unit, thereby expanding the response channel count.

2. Description of Related Art

As high technology systems, such as avionics or weapons systems, become increasingly reliant upon sophisticated electronic or electromechanical components, the number and complexity of test procedures required to provide support for the systems also increases.

A variety of automated test systems have been developed which enable implementation of a large number of relatively complex test procedures without substantially increasing the level of skill and time required to operate the systems. These systems have in common the ability to send stimulus information to the UUT, and to sample and analyze responses from the UUT.

For example, the Hewlett-Packard Corporation currently manufactures a system known as the HP16500 Logic Analysis System (LAS) designed to apply stimuli to the UUT using a stimulus sub-system, the responses being stored in a response sub-system and then compared to the expected responses generated by a software simulation tool to determine whether the UUT is good or faulty. Both the stimulus and response sub-systems are conveniently contained in a single unit for use in an integrated automated test station. The number of response channels available when using a single test control unit such as HP16500 is dependent on the configuration of stimulus and response circuit cards in the unit's card cage. An optimal balance of stimulus and response channels in the HP16500, for example, is achieved by fully populating the card cage with three stimulus cards and two response cards. This configuration provides 160 response channels.

It is not uncommon, however, for state-of-the-art UUTs to require more response channels than is provided by the HP16500 and other conventional test control units. While the channel count can be increased by adding another discrete test control unit to the system, this is impractical for reasons of cost and size, and also because of the software complications involved in simultaneous control of the two units. As a result, it would be desirable to provide a channel expander arrangement which can be used with, or retrofitted onto, an existing unit in order to enable the existing unit to accommodate UUTs with increased channel requirements but without requiring significant modification of the existing unit. No such channel expander arrangement is currently available.

SUMMARY OF THE INVENTION

It is accordingly an objective of the invention to provide an interface circuit arrangement in which a number of available channels on one side of the interface differs from the number of available channels on the other side.

It is also an objective of the invention to provide an interface arrangement for an automated test station of the type in which a test control unit sends stimulus information to a UUT, sample responses output by the UUT, analyzes the responses to determine whether the UUT is good or faulty, and in which the UUT sees a number of available response channels which exceeds the number provided for by the test control unit.

It is a still further objective of the invention to provide an automated test station of the type in which a test control unit sends stimulus information to a UUT, samples responses from the UUT, and analyzes the responses to determine whether the UUT is good or faulty, and in which the interface circuit presents the UUT with more response channels than the test control unit is capable of accepting.

These objectives are accomplished by providing a response channel expander circuit which generates additional response channels from the stimulus channels provided by the basic unit, the additional response channels being made available to the UUT. An exemplary system includes a response expander circuit board capable of generating 320 response channels which are made available to the UUT, the data being converted to the standard 160 response channels for input to the basic test unit. The response expander circuit board may be used with a stimulus expander circuit board, but the operation of the response board is independent of the operation of the stimulus board, and a stimulus expander circuit may not be necessarily be required even where the response expander board is used.

In an especially advantageous embodiment of the invention, the preferred response expander card, in conjunction with existing test software, provides an increase in the response channel count by multiplexing the UUT responses such that a first predetermined number of channels in a UUT output are directly supplied to the test control unit while the remaining channels are held and supplied subsequently. In this embodiment, the preferred response expander circuit includes a plurality of eight bit to four bit multiplexers and a timing circuit which causes the multiplexer to output data from alternate inputs on alternate clock cycles.

DETAILED DESCRIPTION OF THE PREFERRED EMBODIMENTS

Figure 1:
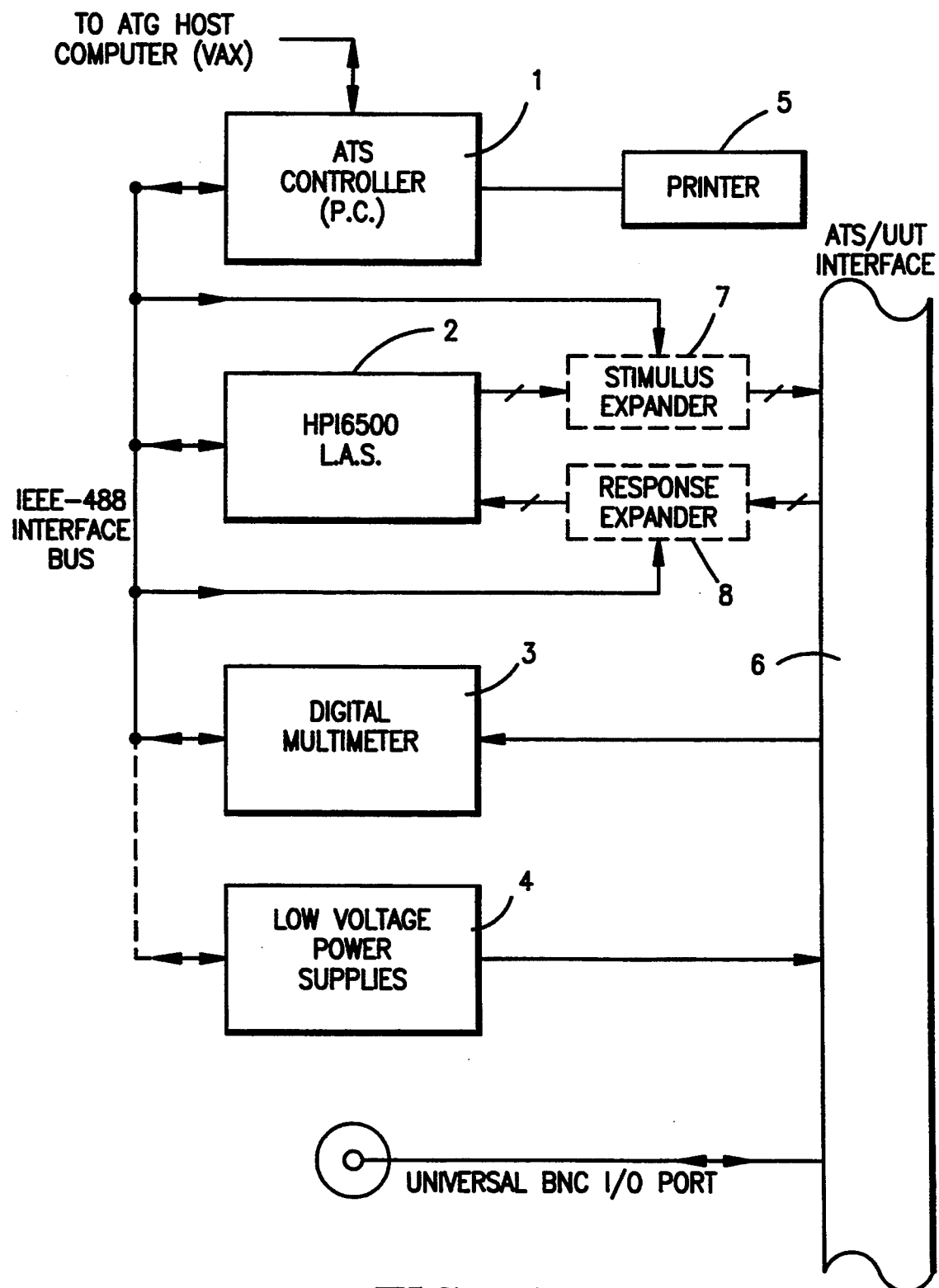
FIG. 1 is block diagram of an automated test system including a response channel expander circuit constructed in accordance with principles of a preferred embodiment of the invention.
Figure 2:
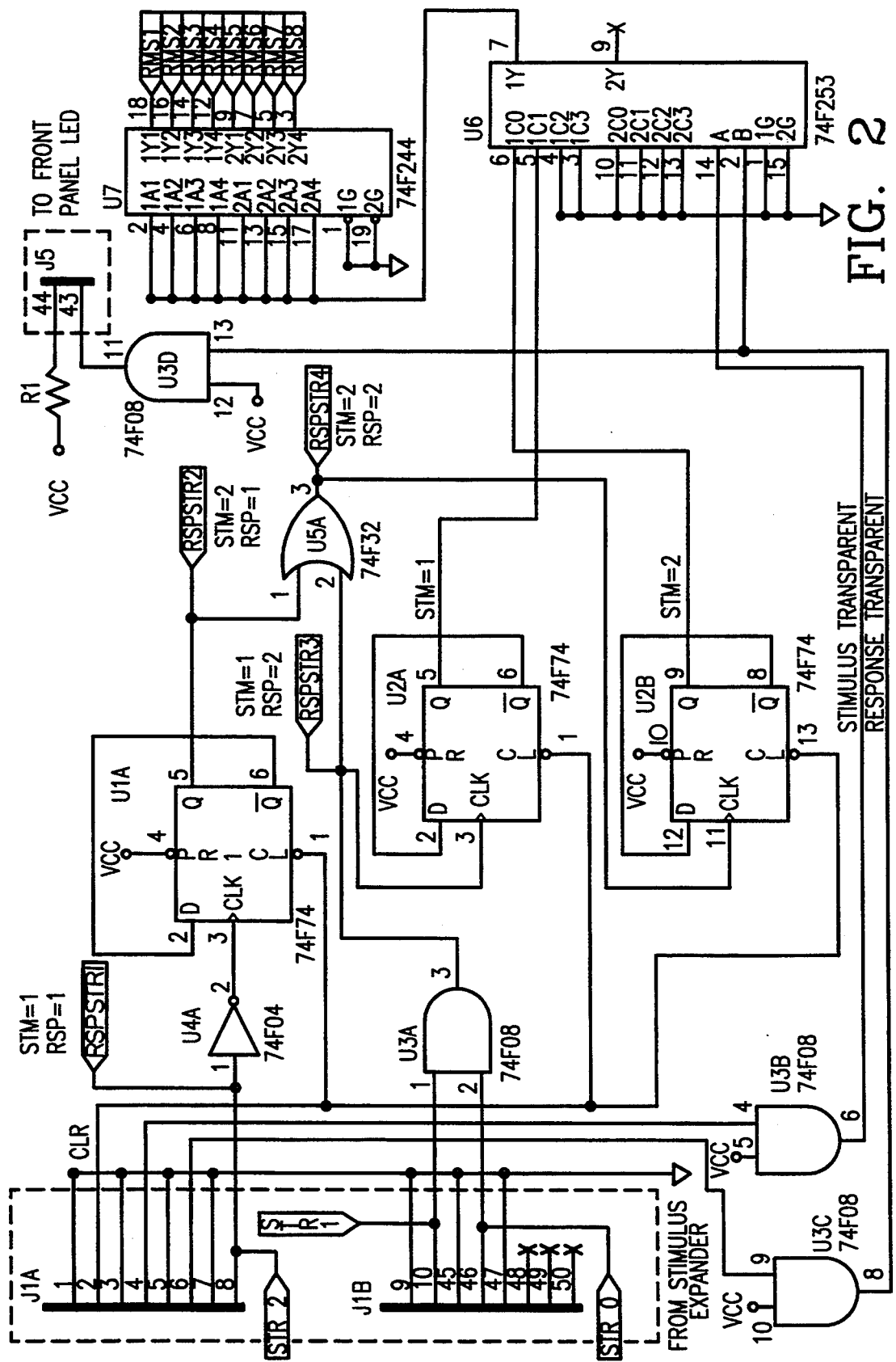
FIG. 2 is a circuit diagram of a timing and control portion of the preferred channel expander circuit.
Figure 3:
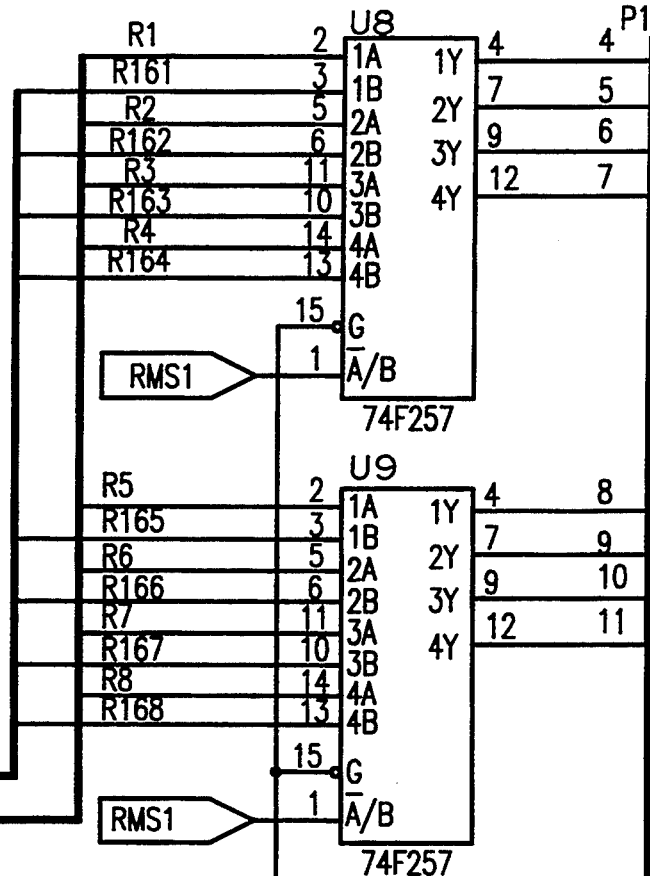
FIGS. 3–12 are circuit diagrams of the data multiplexing portion of the preferred channel expander circuit.
Figure 4:
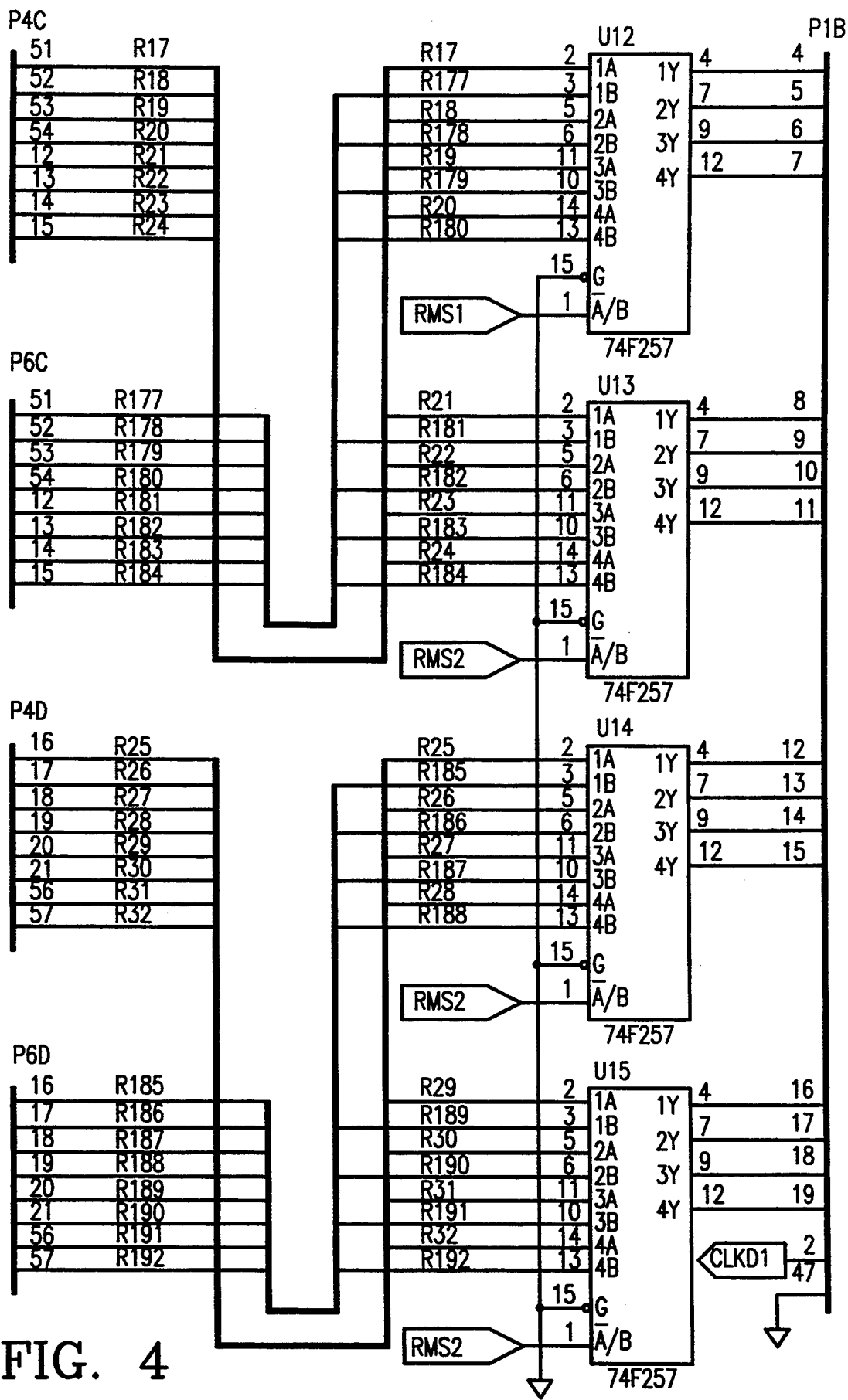
Figure 5:
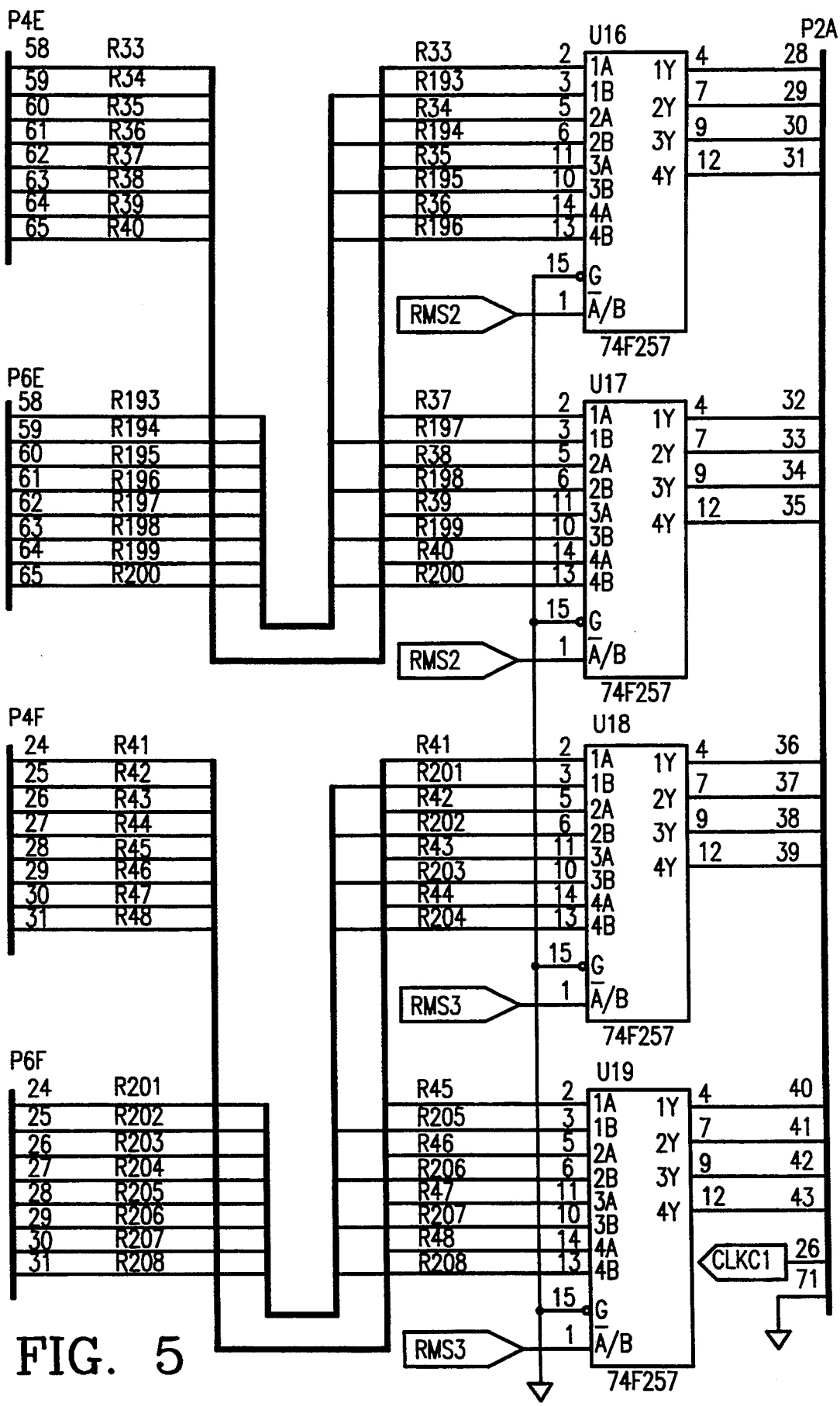
Figure 6:
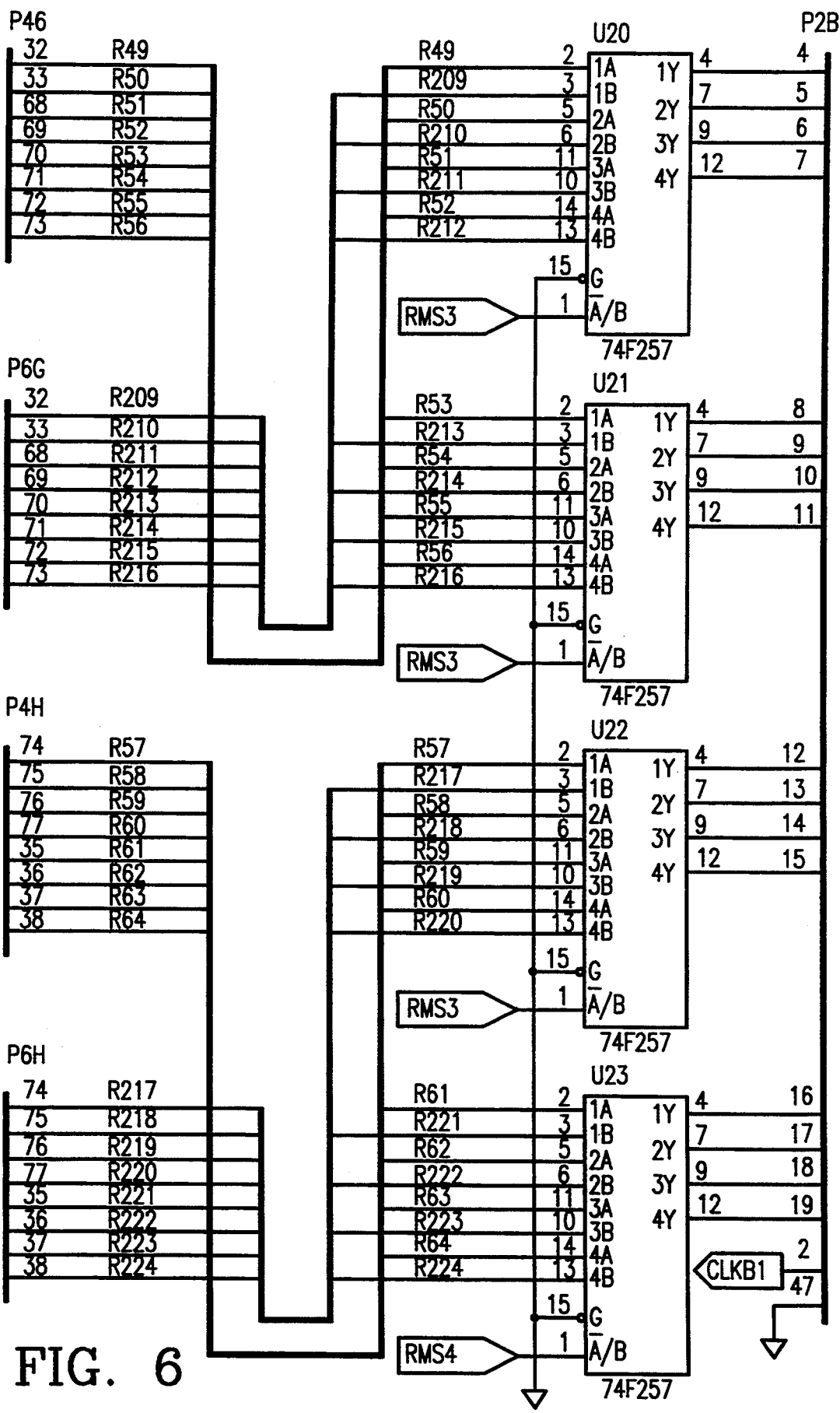
Figure 7:
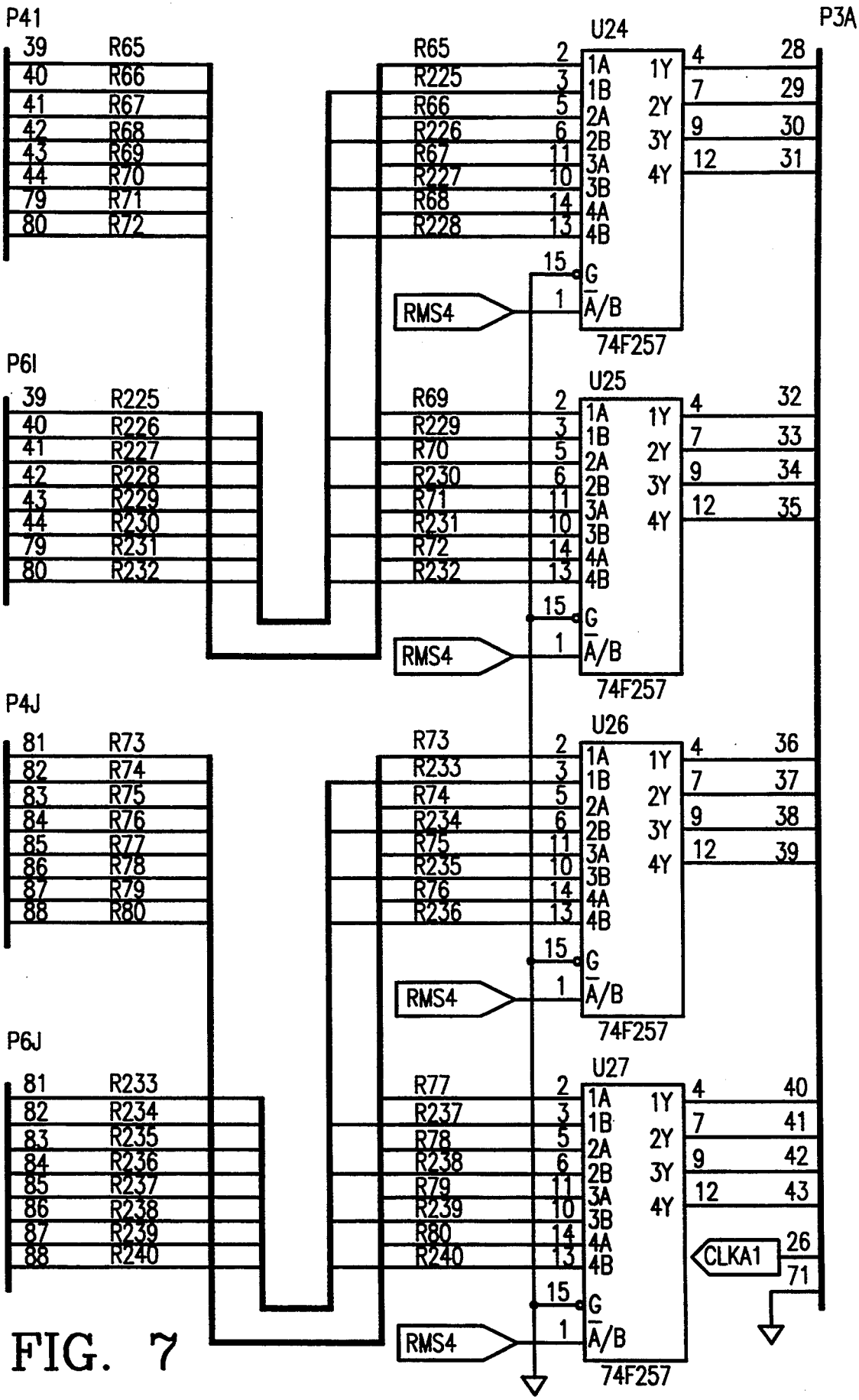
Figure 8:
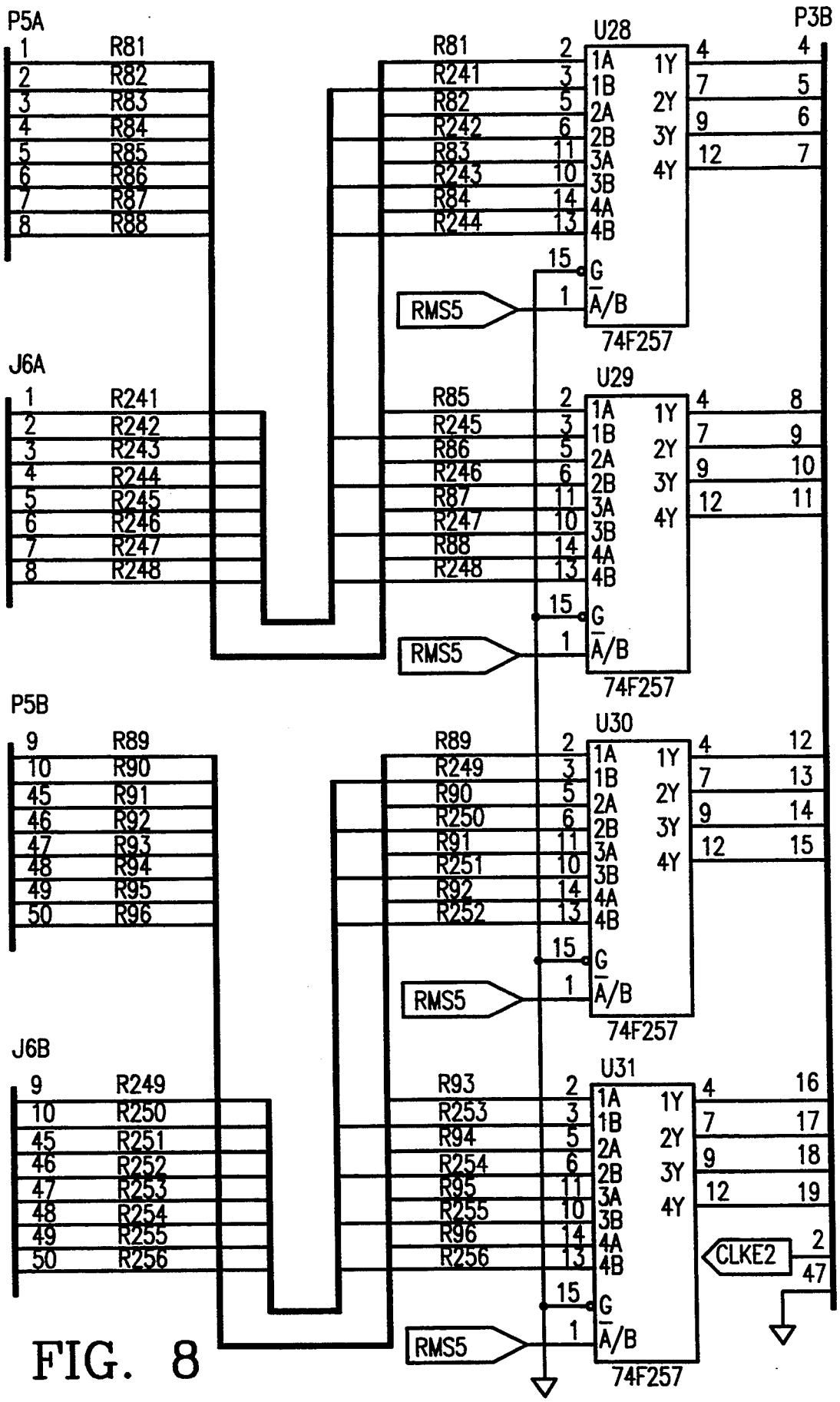
Figure 9:
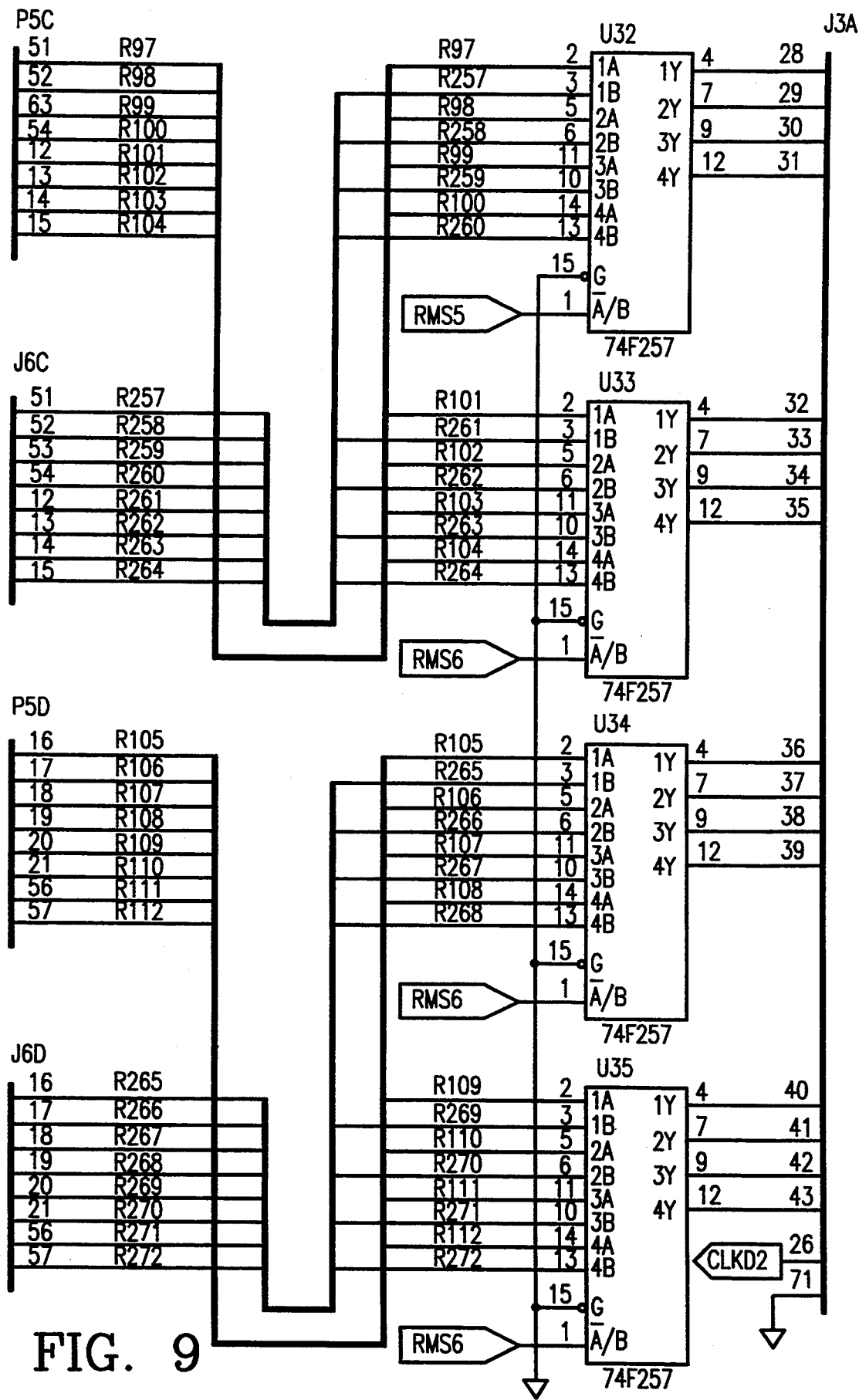
Figure 10:
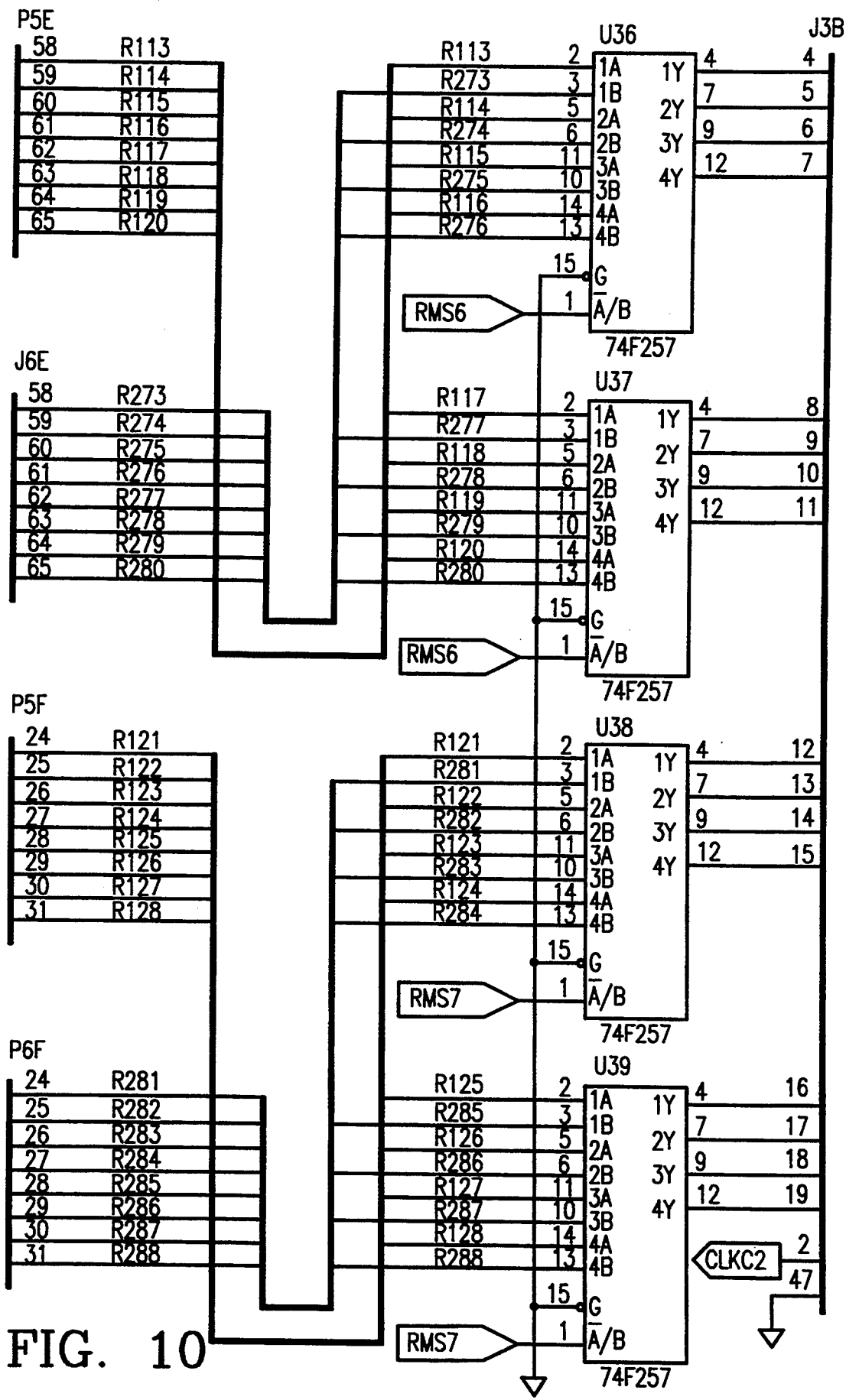
Figure 11:
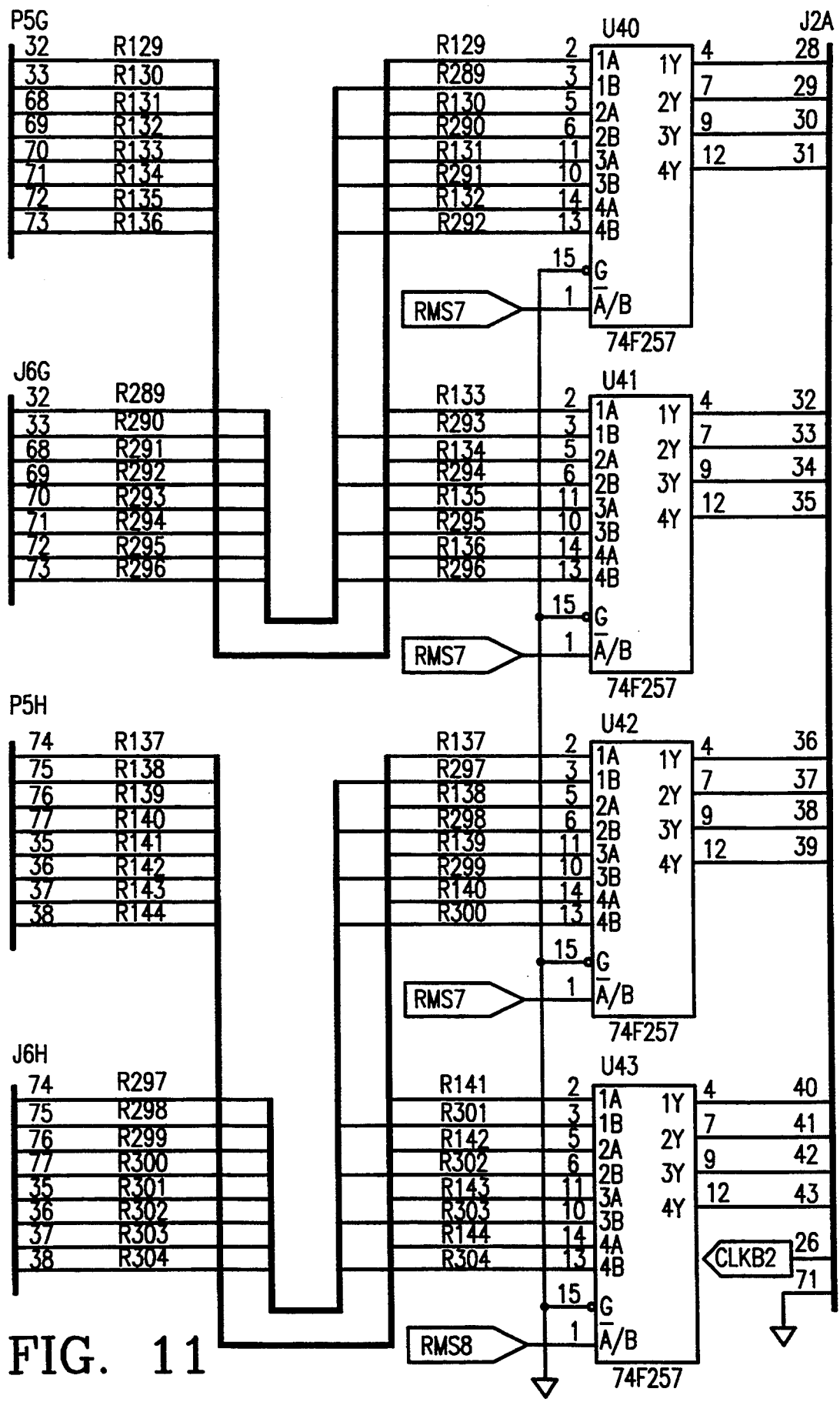
Figure 12:
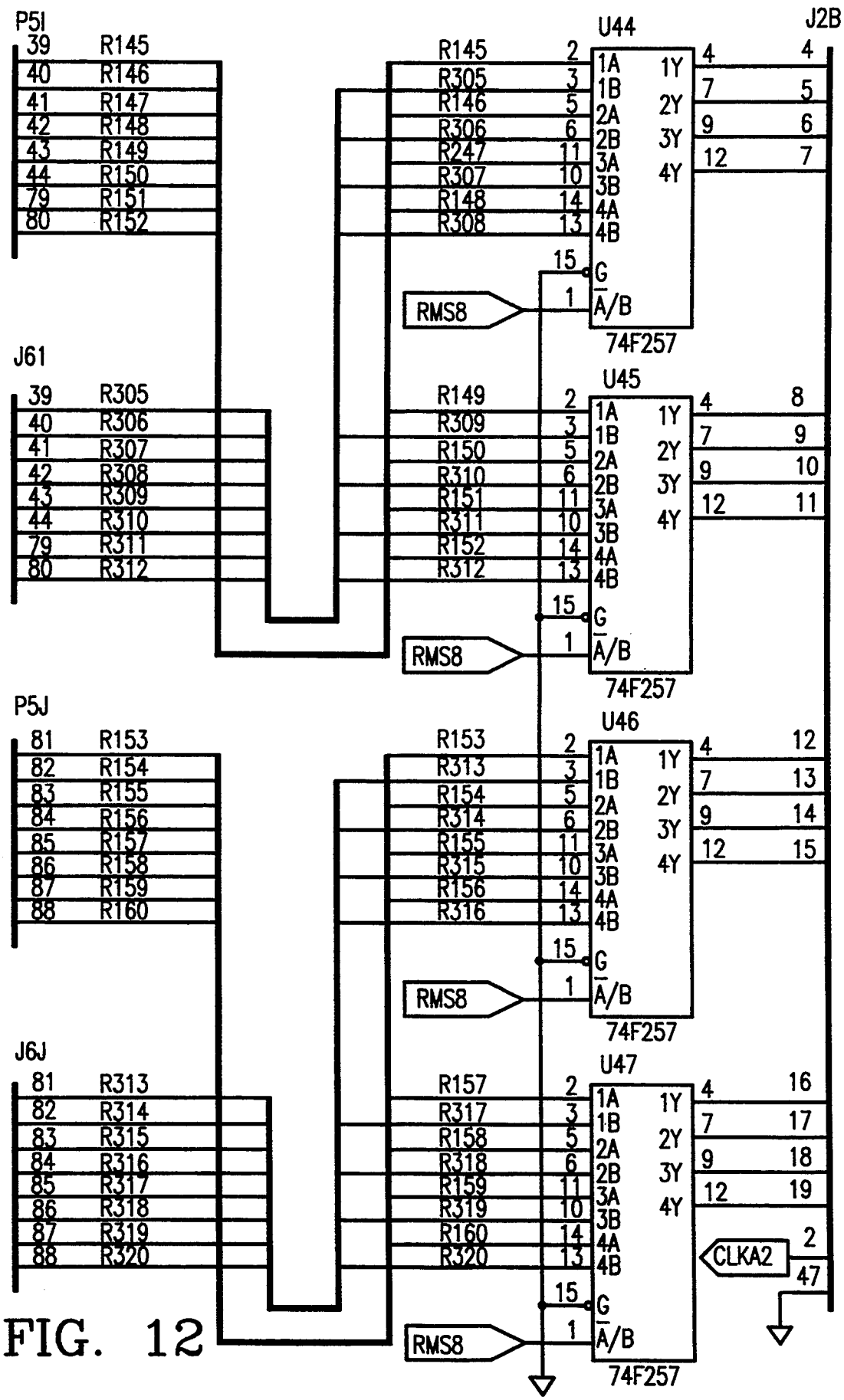

FIG. 1 is a block diagram of an automated test system which includes the channel expander circuit of the preferred embodiment of the invention. The test system includes a PC controller 1 of known type and an Hewlett-Packard 16500 Logic Analysis System 2. The PC controller 1 controls both the digital test procedure carried out by the HP16500 and analog test procedures carried out by a digital multimeter 3. Power supplies 4 for the unit under test may also be controlled by the controller, and results printed out on a printer 5 on-site or transmitted to a host computer such as a VAX. The PC controller 1, the HP16500 basic test unit 2, and the multimeter 3 are preferably connected together via a standard IEEE-488 interface bus, while the interconnections with the UUT will depend on the nature of the UUT accommodated by interface 6.

The HP16500 which forms the digital sub-section of the test station has the capability of receiving 160 response channels. A response channel for this application is defined as an input of the digital sub-section that receives and distinguishes either a high logic level, usually 5 volts direct current (VDC), or a low logic level, usually 3 volts direct current, supplied by the UUT, and therefore receives single digital bits. The main function of the interface circuit is to allow the 160 response channels of the basic test unit to receive data from as much as 320 channels over which the UUT can output data.

Although the specific circuitry shown in FIG. 2–12 is especially adapted for use with the 160 response channels of the HP16500 basic test unit, it will be appreciated by those skilled in the art that the preferred channel expander circuitry may be used in a variety of contexts in which channel expansion which is transparent to devices on either side of the interfaces required. In addition, it is noted that the response channel expander circuit shown may be used with the stimulus channel expander circuit described in copending application Ser. No. 08/153,193, filed Nov. 17, 1993. The number of channels at the input and output may be varied simply by varying the number of multiplexers while maintaining the output-to-input ratio of two-to-one, as will be apparent from the following description, or by modifying or replacing the multiplexer circuitry to divide the number of output channels by three or more rather by two, with corresponding modification of the control circuitry.

The circuit components in the following description are identified in the drawings by part numbers in a manner which will be familiar to those skilled in the art. Of course, a wide variety of equivalent circuit elements for each of the depicted circuit elements are available and may be freely substituted depending on the requirements of the basic test unit and the UUT in question. The following is a relatively detailed description of the various constituent elements of the invention, but implementation details such as impedances, voltages, and so forth, have been omitted in the interest of clarity. The implementation details will be readily obtainable by those skilled in the art, particularly in view of the illustrated part numbers.

The timing signals are received at terminals J1A and J1B. In the case where the stimulus expander circuit disclosed in copending U.S. patent application Ser. No. 08/153,193, filed Nov. 17, 1993, is also used, the timing signals may conveniently be provided first to the stimulus board since the STIMULUS TRANSPARENT signal is also used for the stimulus circuit, while the RESPONSE TRANSPARENT signal can be passed directly through the stimulus board. Ultimately, the various timing signals are controlled by the LAS basic control unit 2 and controller 1, for example in the manner disclosed in copending U.S. patent application Ser. No. 08/153,192, filed Nov. 17, 1993.

Initially, the control signals from controller 1, designated RESPONSE TRANSPARENT and STIMULUS TRANSPARENT, are input through respective AND gates U3B and U3C to the A and B terminals of a dual 4-line to 1-line data selector/multiplexer U6. The A and B inputs together form a binary number which ranges from 0 to 4, the state of the Y outputs 1Y and 2Y corresponding to input terminals 1C0–1C3 and 2C0–2C3, respectively depending on the state of terminals A and B. Since all of the input terminals are connected to ground except for 1C0 and 1C1, the 1Y output of multiplexer U6 will be high on binary 0 or 1, i.e., only when the STIMULUS TRANSPARENT signal is low, and either the RESPONSE TRANSPARENT signal is low and the Q output of flip flop U2A, to which terminal IC0 is connected, is high, or when the RESPONSE TRANSPARENT signal is high and the Q output of flip flop U2B, to which terminal 1CI is connected, is high. When either of these events occurs, a clock signal RMS1 to RMS8 is distributed to multiplexers U8 to U47 in response to input at terminals 1A1 to 2A4 of buffer U7 of the output of terminal 1Y of multiplexer U6.

The outputs of flip flops U2A and U2B are responsive, via flip flop U1A and gates U4A, U3A, and U5A, to signals STR0–STR2 output by basic test unit 2 (STR2 shall hereinafter be referred to as RSPSTR1). The Q output of flip flop U1A is set to high on the trailing edge of signal RSPSTR1. This Q output (RSPSTR2) causes OR gate U5A to output a high signal which triggers the Q output of flip flop U2B, and consequently the Y output of multiplexer U6, whenever the RESPONSE TRANSPARENT signal is low. The Q output of flip flop U2B is also set to high when signals STR0 and STR1 are high, as a result of AND gate U3A, while flip flop U2A is triggered on the output of AND gate U3A (RSPSTR3) such that, whenever signal RSPSTR3 is high, output 1Y will be high regardless of the state of the RESPONSE TRANSPARENT signal.

As a result of the above-described arrangement, when both the RESPONSE TRANSPARENT and STIMULUS TRANSPARENT signals are low, multiplexer U6 outputs a high signal on either the RSPSTR1 or RSPSTR3 (STR0 and STRI high) outputs. When the response transparent signal is high, the output is on the RSPSTR3 signal only.

Optionally, a gate U3D may be provided to provide an output to a front panel LED to indicate the state of the response transparent signal. In addition, an inverter U4A is provided to account for the positive-edge triggering of flip flop U1A, but would be unnecessary if flip flop U1A were negative-edge triggered.

The outputs RSM1 to RMS8 of buffer U7 thus timed are input to the respective quadruple 2-line to 1-line data selector/multiplexers U8–U47 shown in FIGS. 3–12 to select between the A and B data inputs depending on the state of the output by buffer U7. When signals RMS1–RMS8 are low, then the A inputs are output by a corresponding Y output, and when the signals RMS1–RMS8 are high, then the Y outputs correspond to the B inputs. The A inputs are connected to receive data signals R1–R 160 from the UUT, and the B inputs are connected to receive data signals R161–R320 from the UUT. The number of Y outputs is 160, the Y outputs being read by the basic test unit on timing signals CLKE1 to CLKA2 as shown in FIGS. 3–16.

In effect, the illustrated arrangement separates the UUT output pattern into two successive basic control unit input patterns, which are input to the control unit at the same rate that data would be input if the number of UUT channels equalled the number of basic test unit channels.

Those skilled in the art will appreciate that, as indicated above, numerous variations of the preferred embodiment as shown and described herein will occur to those skilled in the art, and consequently it is intended that the invention not be limited by the description thereof, but rather it be defined solely by the appended claims.

We claim:

1. Apparatus for enabling a first device having a plurality of input channels to receive data from a second device having output channels greater in number than said plurality of input channels, comprising:
a multiplexer having two sets of data inputs connected to receive data from said second device and a data output connected to output data to said first device;
means for generating a timing signal and supplying the timing signal to said multiplexer, said timing signal causing a different one of said two sets of data inputs to be outputted by said multiplexer each time data is ready to be received one of the data inputs to said first device, wherein said timing signal generating and supplying means comprises first data select means for generating a first data select signal which causes the multiplexer to select a first one of said two sets of data inputs whenever a response transparent signal received by the timing signal generating means from a controller is low and either a first of three clock signals are received by the timing signal generating means from the second device or the second and third of the three clock signals are simultaneously high, and second data select means for generating a second data select signal which causes the multiplexer to select a second one of the two sets of data inputs whenever the second and third of the three clock signals are received from the second device and the response transparent signal is high.

2. Apparatus as claimed in claim 1, wherein the first and second data select means comprise first and second edge-triggered flip flops having outputs respectively connected to different inputs of a second multiplexer connected to a data select input signal of said multiplexer which has two sets of data inputs, said multiplexer which has two sets of data inputs being referred to hereinafter as the first multiplexer, the second multiplexer inputs being selected by the response transparent signal, with the flip flop outputs being triggered by a third flip flop which in turn is triggered on the negative edge of the first clock signal, via an OR gate having a second input connected to an output of an AND gate having inputs connected to receive the second and third clock signals, the output of the AND gate also being connected to a clock input of the second flip flop.

3. Apparatus as claimed in claim 2, wherein said first multiplexer is a 2-line to 1-line multiplexer.

4. Apparatus as claimed in claim 1, wherein said multiplexer is a 2-line to 1-line multiplexer.

5. Apparatus as claimed in claim 4, wherein said first device is a basic test control unit of an automated test station and said second device is a unit under test.

6. Apparatus as claimed in claim 5, wherein the number of input channels is 160 and the number of output channels is 320.

7. Apparatus for transmitting data to a first device having a plurality of input channels from a second device having a plurality of output channels, comprising:
means for separating the plurality of output channels into two groups;
means for multiplexing the two groups so that the groups are supplied sequentially to the first device, and
means for generating and supplying timing signals to said multiplexer means which causes the multiplexer means to output one of said two groups each time data is ready to be received at an input;
wherein said timing signal generating and supplying means comprises first data select means for generating a first data select signal which causes the multiplexer to select a first one of said two sets of data inputs whenever a response transparent signal received by the timing signal generating means from a controller is low and either a first of three clock signals are received by the timing signal generating means from the second device or the second and third of the three clock signals are simultaneously high, and second data select means for generating a second data select signal which causes the multiplexer to select a second one of the two sets of data inputs whenever the second and third of the three clock signals are received from the second device and the response transparent signal is high.

8. Apparatus as claimed in claim 7 further comprising means for generating and supplying timing signals to said multiplexer means which causes the multiplexer means to output one of said two patterns to each time data is ready to be received at an input.

9. Apparatus as claimed in claim 8, wherein said timing signal generating and supplying means comprises first data select means for generating a first data select signal which causes the multiplexer to select a first one of two sets of data inputs whenever a response transparent signal is low and either a first of three clock signals are received from the second device or the second and third of the three clock signals are simultaneously high, and second data select means for generating a second data select signal which causes the multiplexer to select a second one of the two sets of data inputs whenever the second and third of the three clock signals are received from the second device and the response transparent signal is high.

10. Apparatus as claimed in claim 9, wherein the first and second data select means comprise first and second edge-triggered flip flops having outputs respectively connected to different inputs of a second multiplexer, the second multiplexer inputs being selected by the response transparent signal, with the flip flop outputs being triggered by a third flip flop which in turn is triggered on the negative edge of the first clock signal, via an OR gate having a second input connected to an output of an AND gate having inputs connected to receive the second and third clock signals, the output of the AND gate also being connected to a clock input of the second flip flop.

* * * * *